(12) United States Patent
Wong et al.

(10) Patent No.: US 9,681,584 B2
(45) Date of Patent: Jun. 13, 2017

(54) QUICK DETACHABLE THERMAL CONNECTOR

(71) Applicant: National Tsing Hua University, HsinChu (TW)

(72) Inventors: Shwin-Chung Wong, HsinChu (TW); Wei-Yuan Hsu, HsinChu (TW); Chin-Fu Chen, New Taipei (TW); Yung Feng Chang, Changhua County (TW)

(73) Assignee: National Tsing Hua University, Hsin Chu (TW)

( * ) Notice: Subject to any disclaimer, the term of this patent is extended or adjusted under 35 U.S.C. 154(b) by 24 days.

(21) Appl. No.: 15/008,423

(22) Filed: Jan. 27, 2016

(65) Prior Publication Data

US 2016/0242322 A1 Aug. 18, 2016

(30) Foreign Application Priority Data

Feb. 16, 2015 (TW) .............................. 104105436 A

(51) Int. Cl.
*H05K 7/20* (2006.01)
*H05K 7/14* (2006.01)

(52) U.S. Cl.
CPC ......... *H05K 7/2049* (2013.01); *H05K 7/1404* (2013.01)

(58) Field of Classification Search
CPC .. H05K 7/1404; H05K 7/1407; H05K 7/1409; H05K 7/1442; H05K 7/20545; H05K 7/2049; F16B 2/14; Y10T 403/76; Y10T 403/7069
See application file for complete search history.

(56) References Cited

U.S. PATENT DOCUMENTS

| 3,820,592 A | * | 6/1974 | Lander | H01L 23/4006 165/185 |
| 3,971,186 A | * | 7/1976 | Havelka | F16B 2/14 403/374.4 |
| 4,318,157 A | * | 3/1982 | Rank | H05K 7/20545 361/704 |
| 4,354,770 A | * | 10/1982 | Block | F16B 2/14 254/104 |

(Continued)

*Primary Examiner* — Daniel Wiley
(74) *Attorney, Agent, or Firm* — Chih Feng Yeh; Huntington IP Consulting Co., Ltd.

(57) ABSTRACT

The present invention relates to a rapidly removable thermal connector including a retainer and a clamper. The retainer has a first wedge connected with a convexity of a first two-convexity tenon and a second wedge. At the outer end of the first wedge has a mortise to allocate a convexity of the first two-convexity tenon; at the inner end of the second wedge has a mortise to allocate a convexity of a second two-convexity tenon. The clamper is used to hold the retainer. At the interior of the outer end of the clamper has a movable unit which is connected to the clamper with a bolt at one end and has a vertical concavity at the other end to match the first convexity of the first two-convexity tenon. At the interior of the inner end of the clamper has a mortise which allocates the fourth convexity of the second two-convexity tenon. The third convexity of the second two-convexity tenon is connected to a mortise at the inner end of the second wedge.

9 Claims, 11 Drawing Sheets

(56) References Cited

U.S. PATENT DOCUMENTS

| | | | | |
|---|---|---|---|---|
| 4,480,287 A * | 10/1984 | Jensen | H05K 7/1404 | 361/707 |
| 4,751,963 A * | 6/1988 | Bui | H05K 7/1404 | 165/80.2 |
| 4,775,260 A * | 10/1988 | Kecmer | F16B 2/14 | 361/801 |
| 4,819,713 A * | 4/1989 | Weisman | H05K 7/1404 | 165/80.2 |
| 4,824,303 A * | 4/1989 | Dinger | F16B 2/14 | 254/104 |
| 4,971,570 A * | 11/1990 | Tolle | H05K 7/1404 | 361/709 |
| 5,071,013 A * | 12/1991 | Peterson | H05K 7/1404 | 211/26 |
| 5,090,840 A * | 2/1992 | Cosenza | H05K 7/1404 | 361/759 |
| 5,220,485 A * | 6/1993 | Chakrabarti | H05K 7/1404 | 165/185 |
| 5,224,016 A * | 6/1993 | Weisman | H05K 7/1409 | 165/80.1 |
| 5,253,963 A * | 10/1993 | Ries | H05K 7/1404 | 403/409.1 |
| 5,382,175 A * | 1/1995 | Kunkel | H05K 7/1404 | 29/525.09 |
| 5,407,297 A * | 4/1995 | Hulme | H05K 7/1404 | 403/24 |
| 5,483,420 A * | 1/1996 | Schiavini | H05K 7/1404 | 211/41.17 |
| 5,485,353 A * | 1/1996 | Hayes | H05K 7/1404 | 165/185 |
| 5,607,273 A * | 3/1997 | Kecmer | H05K 7/1404 | 411/24 |
| 5,779,388 A * | 7/1998 | Yamamoto | H05K 7/1404 | 361/741 |
| 6,249,936 B1 * | 6/2001 | Webster | H05K 7/1404 | 24/514 |
| 6,285,564 B1 * | 9/2001 | O'Brien | H05K 7/1404 | 361/759 |
| 6,425,706 B1 * | 7/2002 | Jalanti | G06F 1/184 | 29/281.5 |
| 6,687,130 B2 * | 2/2004 | Adams, Sr. | H05K 7/1404 | 361/174 |
| 7,336,493 B2 * | 2/2008 | Berkenbush | H05K 7/2049 | 165/80.2 |
| 8,045,332 B2 * | 10/2011 | Lee | H05K 7/1404 | 361/756 |
| 8,208,265 B2 * | 6/2012 | Suarez | H05K 7/1404 | 361/748 |
| 8,456,846 B2 * | 6/2013 | Mosier | F16B 2/14 | 361/728 |
| 8,967,903 B1 * | 3/2015 | Sharfi | F16B 12/40 | 403/374.4 |
| 9,167,714 B2 * | 10/2015 | Paquette | H05K 7/1404 | |
| 2003/0146176 A1 * | 8/2003 | Danello | H01R 4/5016 | 211/26 |
| 2005/0267600 A1 * | 12/2005 | Haberman | A61F 2/76 | 623/38 |

* cited by examiner

QUICK DETACHABLE THERMAL CONNECTOR

CROSS-REFERENCE TO RELAYED APPLICATIONS

The present application claims the benefit of TAIWAN Patent Application Serial Number 104105436 filed on Feb. 16, 2015, which is herein incorporated by reference.

TECHNICAL FIELD

The present invention generally relates to a thermal connector, and more particularly, to a quick detachable thermal connector.

BACKGROUND OF RELATED ART

Nowadays, techniques and network data are more numerous and complex than ever. High-performance server racks are designed with multiple aligned printed circuit boards (PCB) on which computing devices and memory storage are mounted. Such rack designs save the space but are faced with increased difficulties for dissipating the heat generated by the electronic elements on the PCB. Without sufficient heat dissipation, the servers can exhibit lower efficiencies or may be even out of order.

In prior art, in each mounting slot of a mounting cold plate, a slander thermal connector is inserted to fix the PCB by pressing its bottom edge against one side wall of the slot. The heat generated from the PCB is dissipated through the side wall to the cooling liquid passing through the cold plate. However, wedges of the traditional thermal connectors are tightened with each other by pressing the thermal connector against the slot wall tightly. There are numbers of gaps between PCB, thermal connector and side wall of the slot when the prior thermal connector is inserted into the slot, so that limited heat could be dissipated across the thermal connector to the other slot wall and then to the cooling liquid. As a result, the thermal resistances of the conventional thermal connectors are quite high. This unfavorable character needs to be improved.

SUMMARY

An objective of the present invention is to provide a quick detachable thermal connector suitable for electronic devices mounted in the rack equipment. The present invention provides additional thermal paths for heat dissipating from the PCB to conduct across the thermal connector so that the thermal resistances associated with the present thermal connector can be lower than those of conventional thermal connectors.

Another objective of the present invention is to provide a quick detachable thermal connector including a retainer and a clamper. The retainer includes a first wedge unit, a second wedge unit and a third wedge unit. The second wedge unit is coupled between the first wedge unit and the third wedge unit. The clamper is used to hold the retainer below a long main frame of the clamper. At the outer part of the clamper, there is a screw hole to allow a screw rod to pass through therein. A movable unit is located below the exterior end of the frame of the clamper. More especially, exterior of the movable unit is coupled with the clamper via the screw rod. The interior end of the movable unit contains a first dual-convexity tenon, whose outer convexity is integrated into the movable unit via tenon-mortise coupling and inner convexity matches with a mortise of the first wedge unit. The inner part of the frame contains a second dual-convexity tenon, whose inner convexity is integrated into the frame via tenon-mortise coupling and outer convexity matches with a mortise of the third wedge unit.

According to one embodiment, the movable unit further comprises a through hole to accommodate a fixer, which can be a screw nut or a plug penetrating through the screw. The fixer keeps the screw rod in connection with the movable unit during the installation or de-installation process. The dual-convexity tenons and the mortises are shaped as a dovetail form.

According to some embodiments, the first, second and third wedge units have a first, second and third recess, respectively. The main frame of the clamper has at least three fourth recesses, corresponding to the first, second and third recess, respectively. Wherein each of the first, second and third recesses have magnetically permeable plate, respectively, each of the fourth recesses have magnetic plate, therefore, three wedge units and the clamper will be combine together by magnetic force to form a detachable thermal connector apparatus.

A further objective of the present invention is to provide a quick detachable thermal connector, formed by a two-wedge retainer and a clamper. The two-wedge retainer, comprising a first wedge unit and a second wedge unit, replaces the three-wedge retainer as describe above.

According to one embodiment, the movable unit further comprises a through hole to accommodate a fixer, which can be a screw nut or a plug penetrating through the screw. The fixer keeps the screw rod in connection with the movable unit during the installation or de-installation process. The dual-convexity tenons and the mortises are shaped as a dovetail form.

According to some embodiments, the first and second wedge unit have a first and second recess, respectively. The main frame of the clamper has at least two third recesses, corresponding to the first and second recesses, respectively. Wherein each of the first and second recesses have magnetically permeable plate, respectively, each of the third recesses have magnetic plate, therefore, two wedge units and the clamper will be combine together by magnetic force to form a detachable thermal connector apparatus.

BRIEF DESCRIPTION OF THE DRAWINGS

The components, characteristics and advantages of the present invention may be understood by the detailed description of the preferred embodiments outlined in the specification and the drawings attached.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims. The layout of components may be more complicated in practice.

Figure 1:
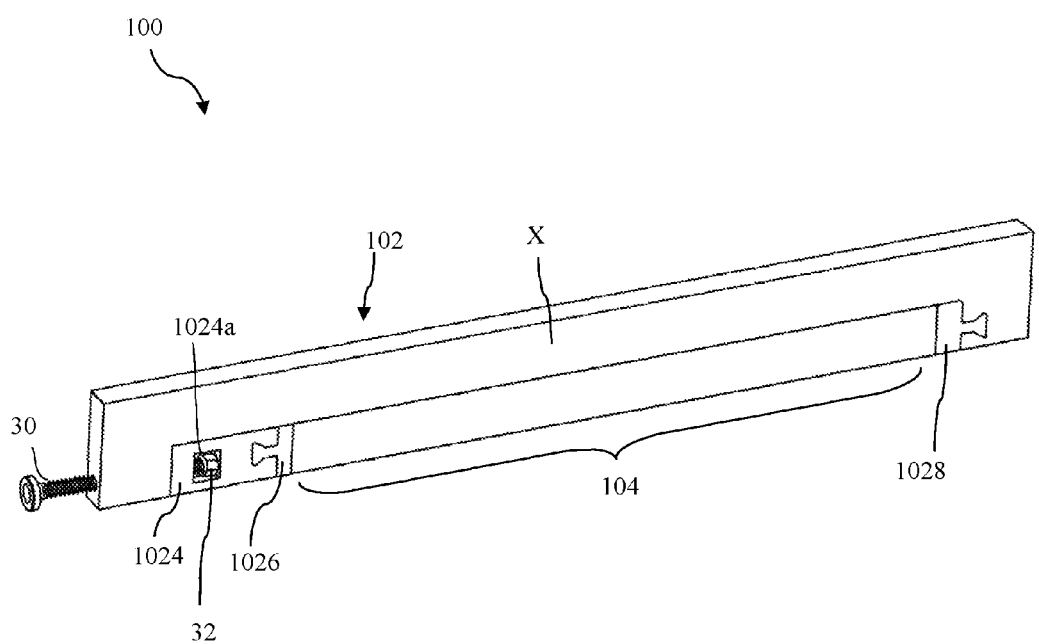
FIG. 1 illustrates a side view of combination of a quick detachable thermal connector according to an embodiment of the present invention.
Figure 2:
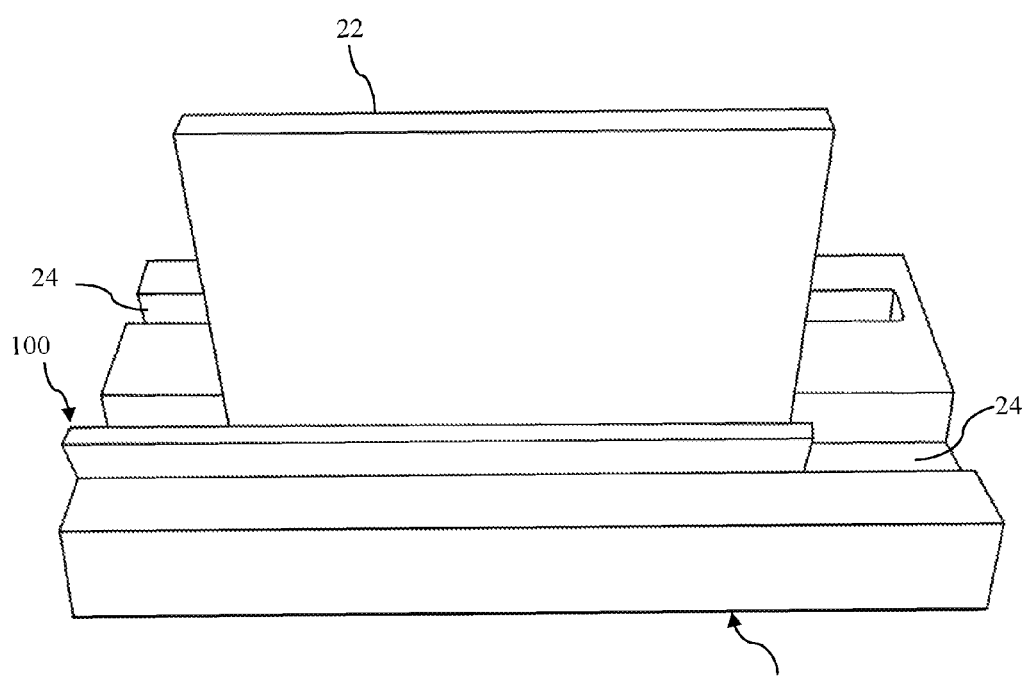
FIG. 2 illustrates a view of combination of thermal connector and PCB according to an embodiment of the present invention.

FIG. 1 illustrates a side view of combination of the quick detachable thermal connector according to an embodiment of the present invention. The quick detachable thermal connector (called the apparatus 100 hereinafter) is formed by a clamper 102 and a retainer 104. The apparatus 100 is located onto a cold plate 20 with multiple slots 24. Printed circuit board (PCB) 22 and the apparatus 100 are located in the slots 24 in parallel with each other. That is, a side of the PCB 22 is touched with an inner wall of the slots 24, the other side of the PCB 22 is touched with a side of the apparatus 100, and the other side of the apparatus 100 is touched with the other inner wall of the slots 24, as shown in FIG. 2. After installation, the clamper 102 of the apparatus 100 can be removed, then leaving the retainer 104 firmly fixed between the slot wall and the retainer 104. The retainer 104 of the present invention can reduce the thermal resistance between the PCB and the cold plate. The present invention further has high performance under the most extreme shock and vibration conditions, such as spacecraft and military aircraft. Due to the tightly fastening of the retainer 104, it will not drop off when the electronic device is performed under high frequency vibration. The retainer 104 is made of metal material which has high thermal conductivity. In one embodiment, the retainer 104 is solid made of copper metal, aluminum alloy, magnesium alloy, or titanium alloy, so as to improve heat dissipation. The clamper 102 is made of high-hardness material, such as including but not limited to aluminum alloys, titanium alloy, iron metal or stainless steel.

Figure 3A:
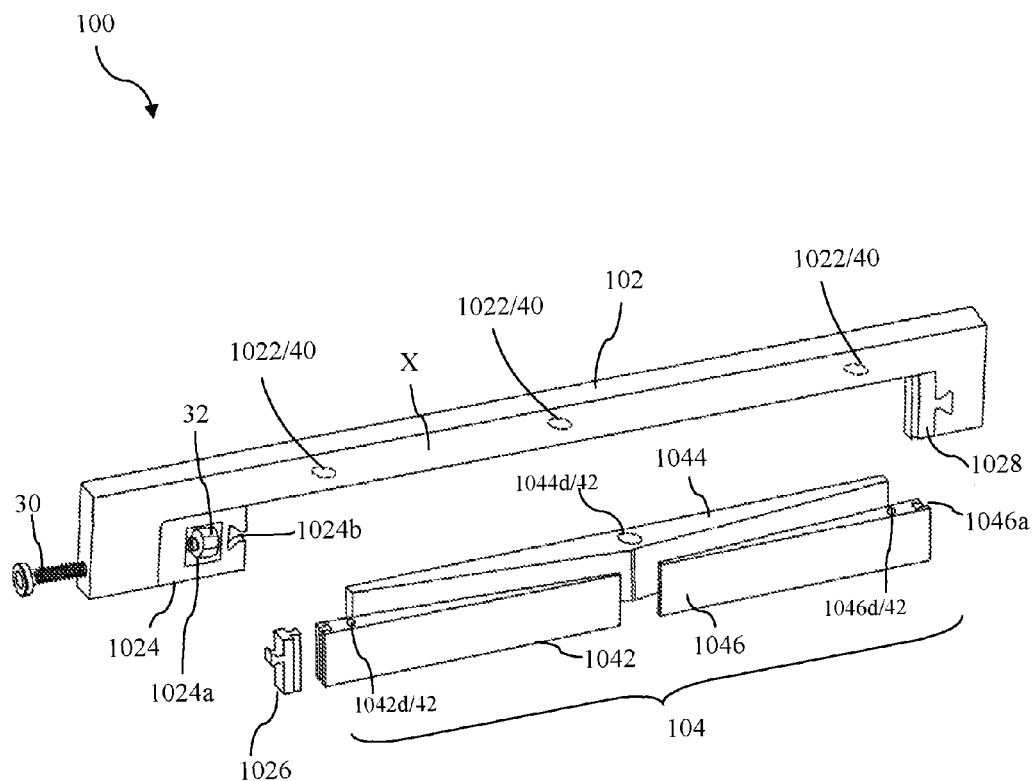
FIG. 3A illustrates an exploded view of clamper and retainer according to an embodiment of the present invention.
Figure 3B:
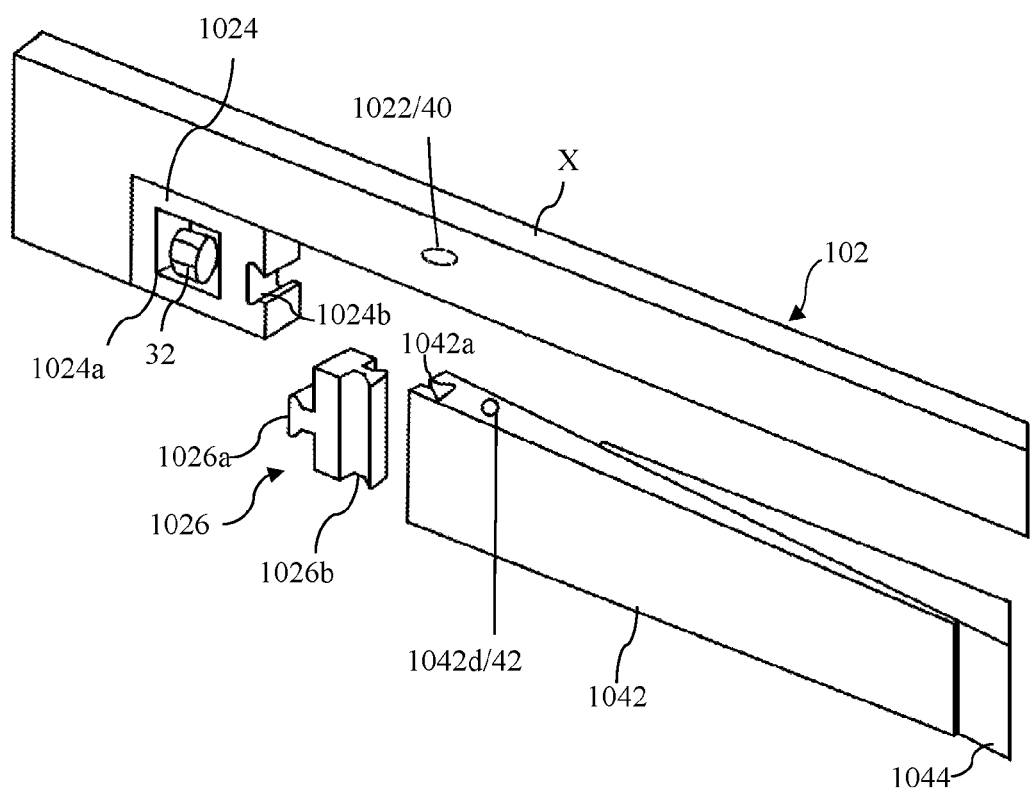
FIG. 3B illustrates a magnified view of a partial region in FIG. 3A.

FIG. 3A illustrates an exploded view of clamper 102 and retainer 104 according to the embodiment of the present invention. FIG. 3B illustrates a magnified view of a partial region in FIG. 3A. The clamper 102 is an upside-down U-shaped. The retainer 104 is located below a long main frame X of the clamper 102. A movable unit 1024 is located below the long main frame X of the clamper 102 at the exterior part. The movable unit 1024 has a horizontal mortise 1024b to mortise with the first convexity 1026a of the dual-convex tenon 1026. The second convexity 1026b of the dual-convex tenon 1026 is used to mortise with the concavity 1042a of the first wedge unit 1042. The dual-convex tenon 1026 is designed to not only couple to the movable unit 1024 and the retainer 104 but also avoid the internal bending force which may arise due to the slight sideward motion of the first wedge 1042 while it is pushed inward (or drawn outward) by the movable unit 1024 during the installing process (or de-installing) process. The interior side of the back-end protrusion of the clamper 102 contains a second dual-convexity tenon 1028 (as shown in FIG. 3A), in which the inner fourth convexity (similar with first convexity 1024b) is integrated into the back-end of the clamper 102 via tenon-mortise coupling. The outer third convexity (similar with second convexity 1026b) is mortised with the vertical concavity 1046a on the back end of the third wedge 1046. In the preferred embodiment, the two convexities of the dual-convex tenon 1026 or/and 1028 are shaped as dovetail-like configuration for matching with dovetail-like mortise 1042a of the first wedge unit 1042 or/and 1046a of the third wedge unit 1046. The shape of the dual-convex convexity 1026 or 1028 and the concavity 1042a or 1046a is not limited to dovetail-like shape, but can be varied or modified by the person skilled in the art in the light of the need in use.

A through hole 1024 is formed at the center of the movable unit 1024 that shape is but not limited to a rectangular shape. The rectangular through hole 1024a can accommodate a fixer 32, which can be a screw nut (as shown in FIG. 3A) or a plug penetrating through the screw rod. The fixer 32 keeps the screw in connection with the movable unit during the installation or de-installation process. It is well understood that the fixer 32 must be matched with screw rod 30 by the skilled person in the art, therefore, the redundancy illustration is omitted hereinafter. Each of the exterior clamper 102 and the movable unit 1024 has respective through hole which is aligned with each other, allowing the screw rod 30 to pass through the two through holes, so that the screw rod 30 can reach into the movable unit 1024 and be fixed by the fixer 32. Since the second convexity 1026b of the first dual-convex tenon 1026 couples with the concavity 1042a of the exterior first wedge unit 1042, when the screw rod 30 is driven inward by a driving tool, the driving force can push the first, second and third wedge units 1042, 1044, and 1046 inward together and lock them into the slots 24. The details of the retainer 104 will be described below.

Figure 4A:
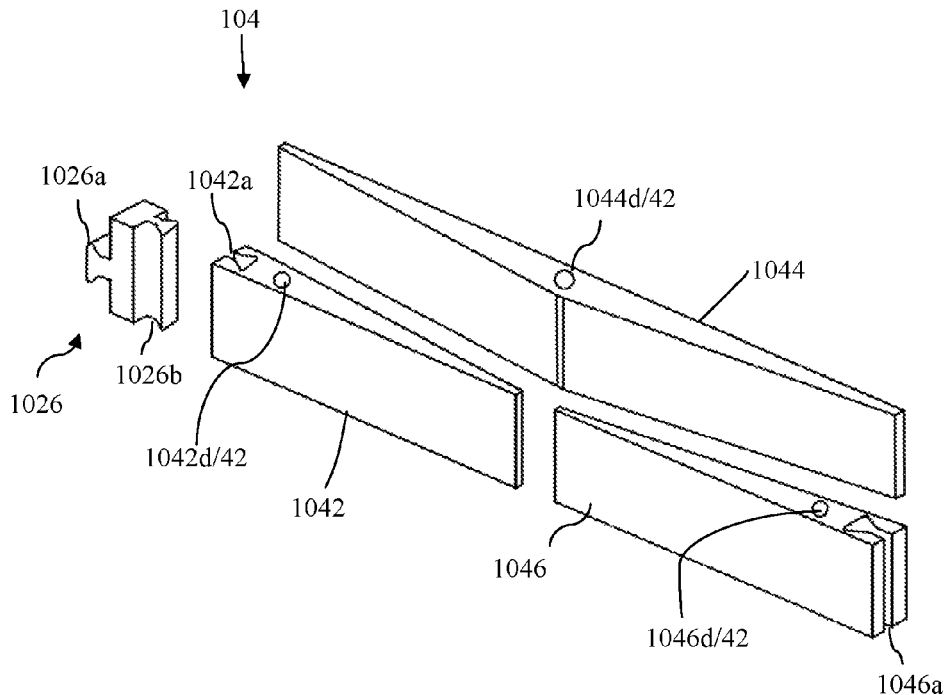
FIG. 4A illustrates a front view of retainer according to an embodiment of the present invention.
Figure 4B:
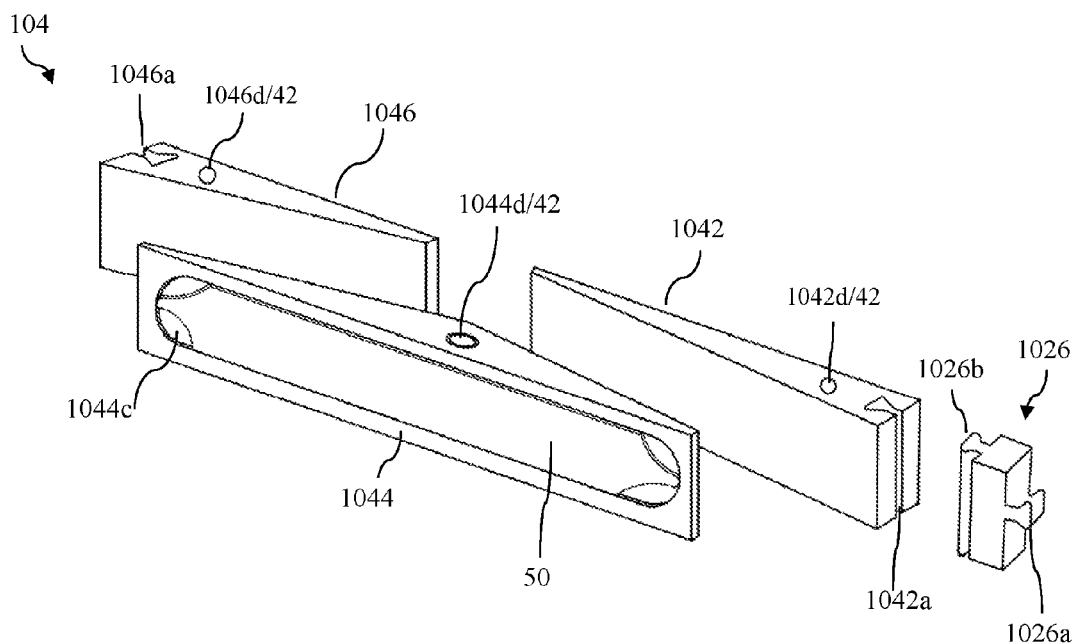
FIG. 4B illustrates a rear view of retainer according to an embodiment of the present invention.

FIGS. 4A and 4B illustrate a front view and rear view of retainer 104, respectively, according to the embodiment of the present invention. The retainer 104 is formed by a first wedge unit 1042, a second wedge unit 1044, and a third wedge unit 1046. The first wedge unit 1042, the second wedge unit 1044 and the third wedge unit 1046 can be coupled with the clamper 102 by magnetic force between the magnetically permeable plates 42 in the recesses 1042d, 1044d, and 1046d, respectively, and the magnetic plates 40 in the recesses on the lower surface of the main frame X of the clamper 102. The mortise 1042a at the exterior end of the first wedge unit 1042 matches with a second convexity 1026b of the first dual-convex tenon 1026, the mortise 1046a at the interior end of the third wedge unit 1046 matches with the third convexity of the second dual-convex tenon 1028. A side rectangular plane of the second wedge unit 1044 contacts with the PCB 22. The surfaces of each of wedges of the retainer 104 can be polished and plated with a soft metal layer to reduce the contact resistances. In one embodiment as shown in FIG. 4B, the rectangular facing surface, between the second wedge unit 1044 and PCB 22, has a rectangular recess 1044c to accommodate an ultra-thin flat heat pipe 50 embedded therein, so that the heat dissipation can be further improved.

In one embodiment, the third wedge unit 1046 further has a vertical mortise 1046a for connecting the third convexity of the second dual-convex tenon 1028 of the clamper 102, as shown in FIG. 3A. The first wedge unit 1042 is coupled to the horizontal mortise 1024b of the movable unit 1024 via the first dual-convex tenon 1026, and the third wedge unit 1046 is coupled to the second dual-convex tenon 1028 via the mortise 1046a at interior end of the third wedge unit 1046. Therefore, the clamper 102 and the retainer 104 will be combined together by magnetic force and tenon-mortise coupling.

Figure 5A:
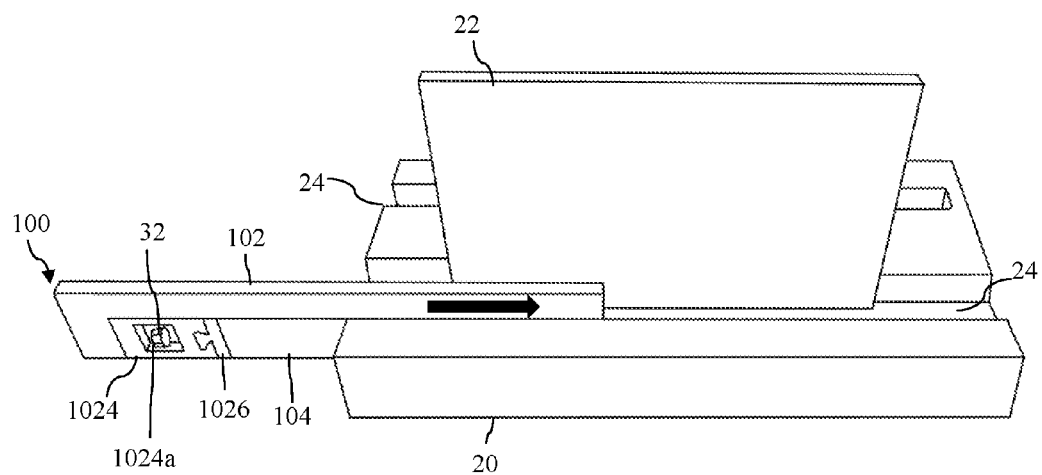
FIGS. 5A-5C illustrate a flow chart of installing the thermal connector according to an embodiment of the present invention.
Figure 5B:
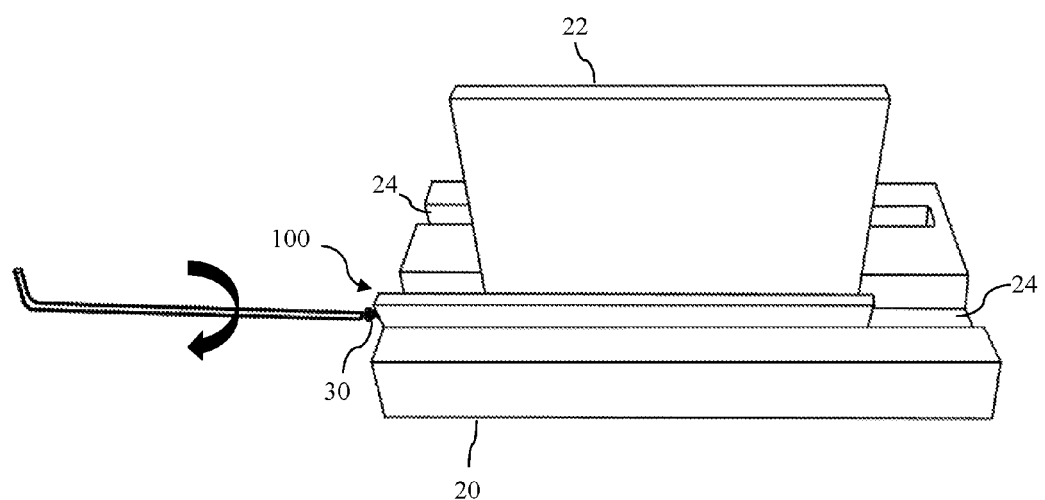
Figure 5C:
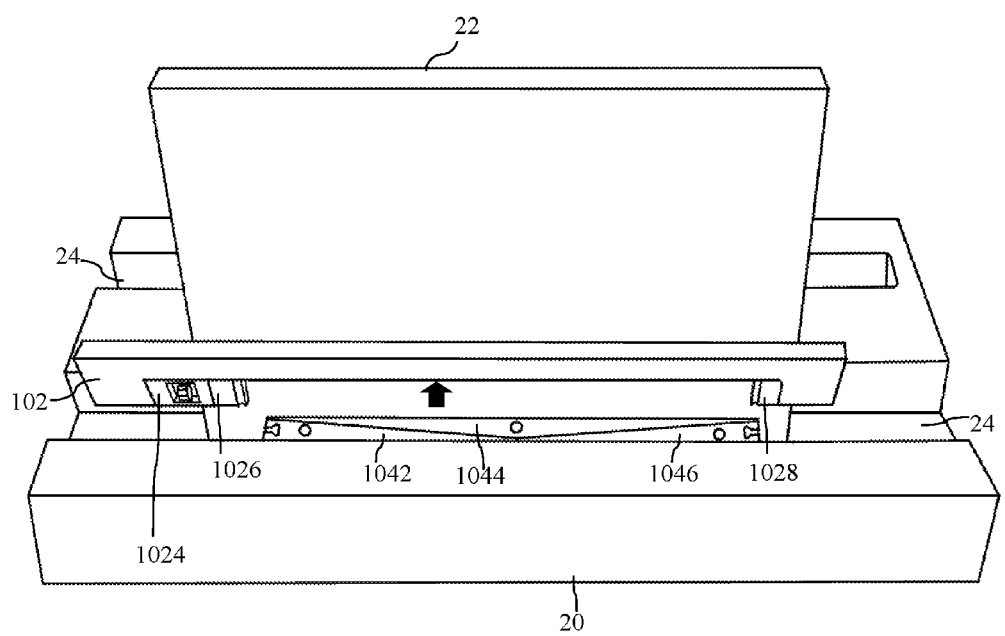

FIGS. 5A-5C illustrate the installing process of the retainer 104 locked into a slot 24 of the cold plate 20. First, coupling the retainer 104, including the first, second, third wedges 1042-1046 together by magnetic force. Afterward, the retainer 104 is integrated with clamper 102 via the connection between the second convexity 1026b of the first dual-convex tenon 1026 and the concavity 1042a of the first wedge 1042, and between the concavity 1046a of the third wedge 1046 and the convexity of the second dual-convex tenon 1028, which is connected to the back-end protrusion of the clamper 102. Then, the integrated apparatus 100 is located near bottom of the PCB 22 along the slots 24 of the cold board 20, as shown in FIG. 5A. When the screw rod 30 is rotated clockwise by a driving tool, the movable unit 1024 and the first dual-convex tenon 1026 will be driven along the slots 24 so that the first, second, and third wedges 1042-1046 are fastened into slots 24 tightly, as shown in FIG. 5B. Finally, the clamper 102 can be taken out from top of the retainer 104, as shown in FIG. 5C.

Figure 6A:
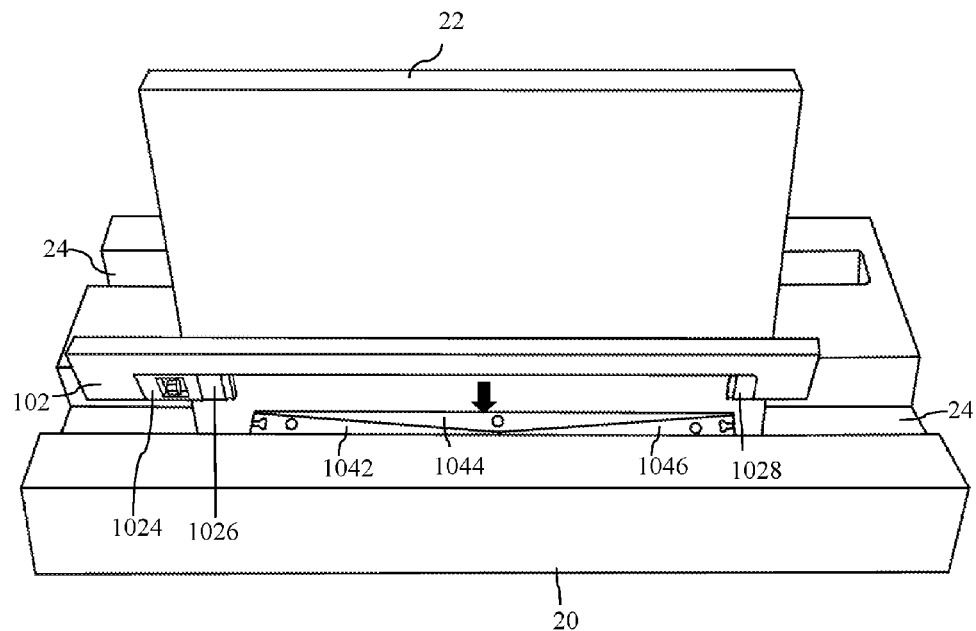
FIGS. 6A-6C illustrate a flow chart of removing the thermal connector according to an embodiment of the present invention.
Figure 6B:
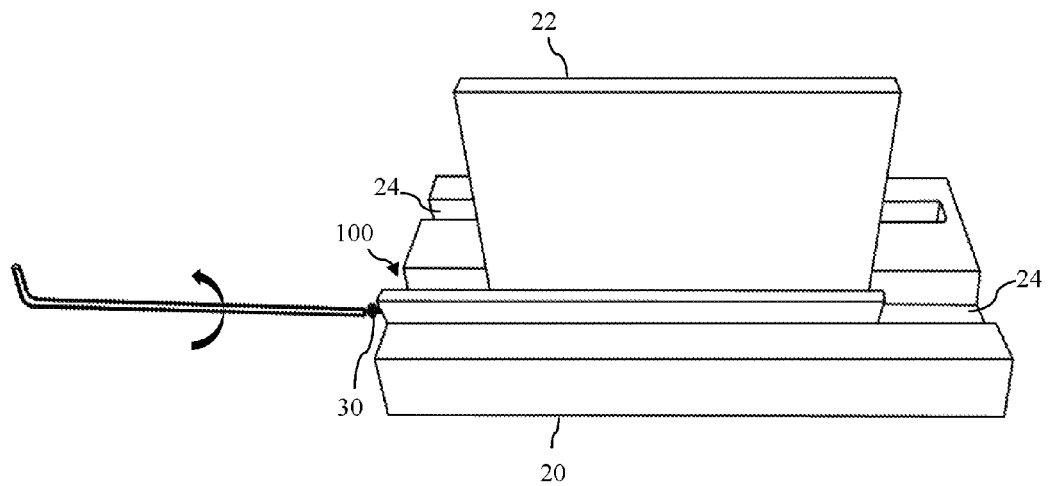
Figure 6C:
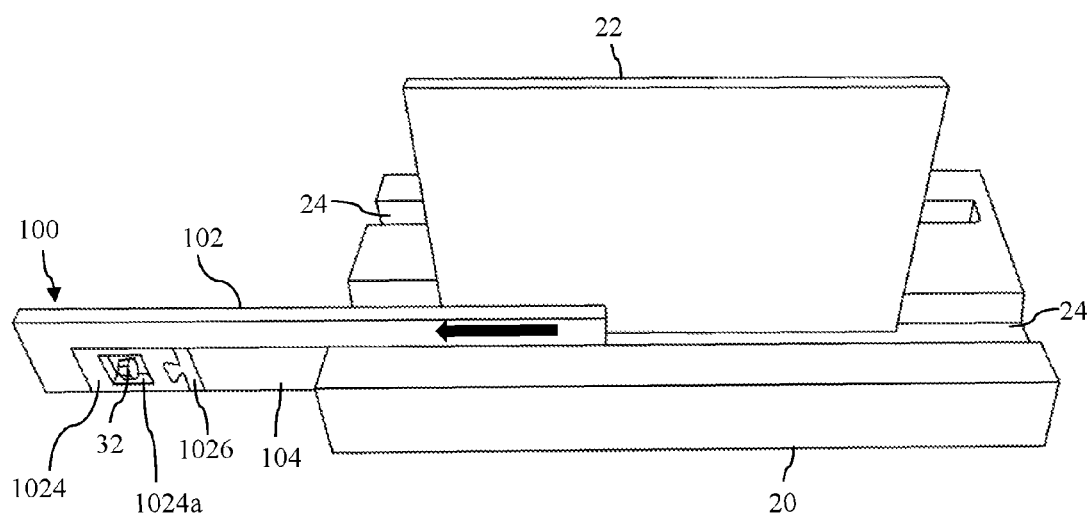

FIGS. 6A-6C illustrate the de-installing process of the retainer 104 out of the slots 24 of the cold board 20. First, as shown in FIG. 6A, re-integrating the clamper 102 and the retainer 104 from top of the retainer 104 by re-coupling the second convexity 1026b of the dual-convex tenon 1026 with the convexity 1042a of the first wedge 1042, and the convexity 1046a of the third wedge 1046 with the convexity of the second dual-convex tenon 1028. Then, rotating the screw rod 30 counterclockwise by using a driving tool, and the retainer 104 would be loosened from PCB 22, as shown in FIG. 6B. Finally, the apparatus 100 can be taken out from the slots 24 of the cold board 20, as shown in FIG. 6C.

Figure 7:
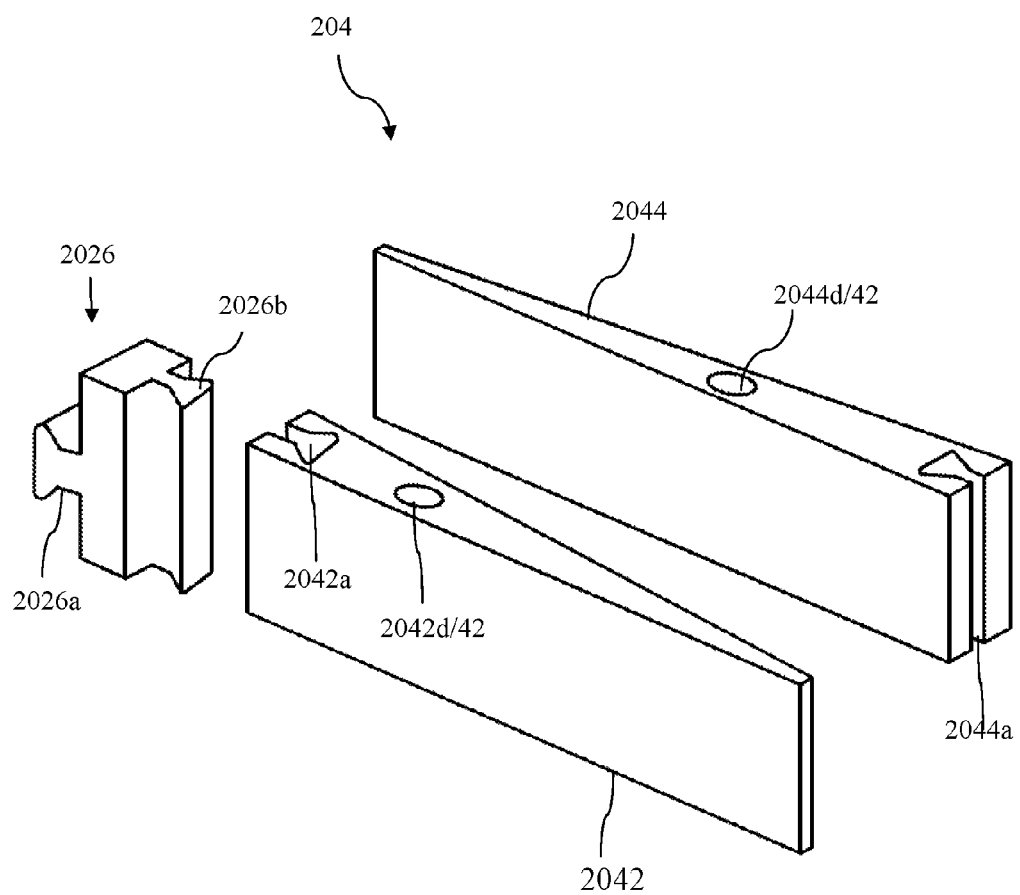
FIG. 7 illustrates a view of the thermal connector according to another embodiment of the present invention.

FIG. 7 illustrates a view of the retainer 204 according to the second embodiment of the present invention. Except for the difference between the retainer 204 of the second embodiment and the retainer 104 of the first embodiment, all other elements or units, such as the clamper, of the second embodiment are the same as those of the first embodiment. Therefore, the operation of the clamper and the retainer of the second embodiment is the same as those of the first embodiment, as shown in FIGS. 5A-5C, 6A-6C. In the second embodiment, the retainer 204 is formed by a first wedge unit 2042 and a second wedge unit 2044. The first wedge unit 2042 has a concavity 2042a to couple with the second convexity 2026b of the dual-convex tenon 2026. On the top surface of each wedge unit has a recess to accommodate a magnetically permeable plate 42. Therefore, all units can be grouped firmly together. The surfaces of the wedges of the retainer 204 can be polished and plated with a soft metal layer to reduce the contact resistances.

In the second embodiment, a rectangular recess is formed on a side rectangular surface of the first wedge unit 2042 (or the second wedge unit 2044), like 1044c shown in FIG. 4B, to accommodate an ultra-thin heat pipe therein, such as 50 shown in FIG. 4B.

Figure 8:
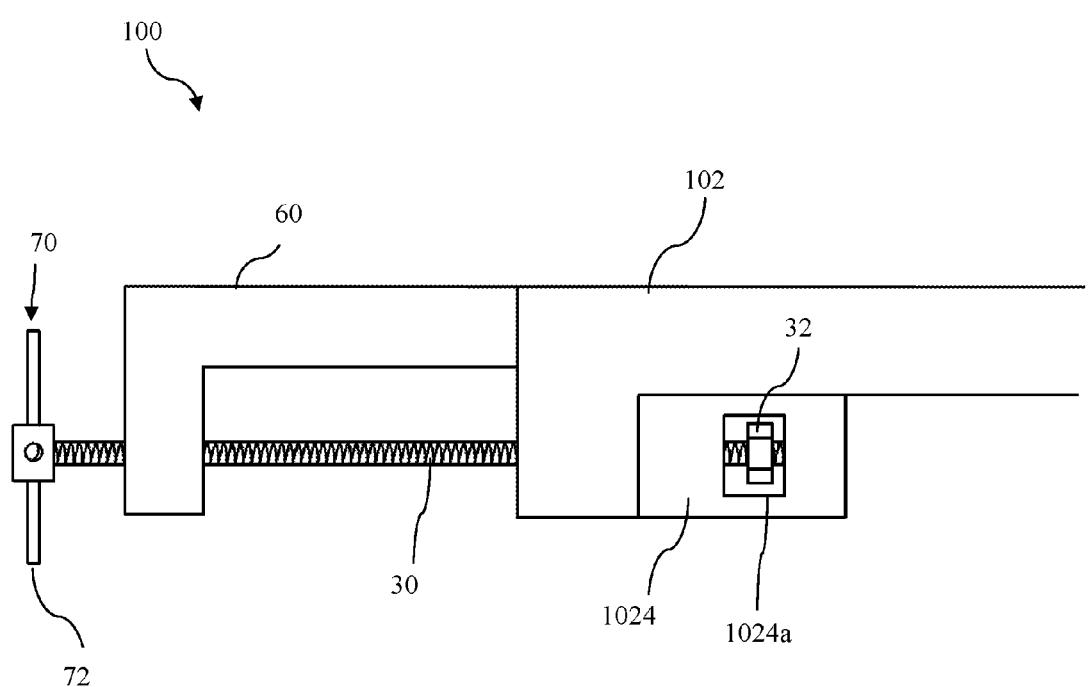
FIG. 8 illustrates a view of the clamper with a handle and a manual screwing mechanism according to an embodiment of the present invention.

FIG. 8 illustrates a diagram of the clamper 102 according to another embodiment of the present invention. The exterior part of the clamper 102 has a handle 60 with a manually driving mechanism 70. The handle 60 is provided for the user to hold the apparatus 100. The manually driving mechanism 70 includes a rotatable stick 72 connected to the exterior end of the screw rod 30 for easy installation and de-installation of the apparatus.

As description above, the present invention provides the quick detachable thermal connector including the retainer 104 and the clamper 102. The clamper 102 can hold the retainer 104, and guide the retainer 104 locked into the slots 24 of the cold plate 22. Then, enforcing at the exterior end of the clamper 102 by the driving tool will push inward the wedge units of the retainer 104 and tightly fasten them between the PCB 22 and the slot wall. After installing, the clamper 102 can be taken out vertically from top of the retainer 104, then leaving only the retainer 104 locked within the slots 24 of the cold plate 20. Accordingly, the retainer 104 can improve the efficiency of heat dissipation and fasten the PCB 22 tightly against intense vibration. In comparison with the prior art, the present invention not only improves the efficiency of heat dissipation but also reduces manufacture cost due to the simple structure of the retainer 104.

It is not limited the shape and direction of "convex" in this texture, it is well understood that shape of the convex must be match with mortise, slot, concavity or recess, therefore, the redundancy illustration is omitted hereinafter. In this texture, the shape of the slot is but not limited to circle, it can be modified or varied by the skilled person in the art depending on the desire and expectation of the user. If the specification refers to "front end" or "exterior", it means at end of the clamper being enforced, and refers to the left side of FIG. 1. In the other hand, if the specification refers to "back end" or "interior", it is the other end of the clamper corresponding to the end being enforced, and refers to right side of FIG. 1. In process of installing the apparatus into the slots of cold board, interior apparatus should be guide into slots before enforcing on the exterior for fastening the retainer.

Various terms used in this disclosure should be construed broadly. For example, if an element "A" is said to be coupled to or with element "B," element A may be directly coupled to element B or be indirectly coupled through, for example, element C. When the specification states that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification refers to "a" or "an" element, this does not mean there is only one of the described elements.

The foregoing descriptions are preferred embodiments of the present invention. As is understood by a person skilled in the art, the aforementioned preferred embodiments of the present invention are illustrative of the present invention rather than limiting the present invention. The present invention is intended to cover various modifications and similar arrangements included within the spirit and scope of the appended claims, the scope of which should be accorded the broadest interpretation so as to encompass all such modifications and similar structures.

What is claimed is:

1. A thermal connector apparatus, comprising:
 a retainer, comprising:
  a first wedge unit having a first mortise;

a second wedge unit, coupled to said first wedge unit, having a second mortise; and a clamper for clamping said retainer, comprising:
- a movable unit at a first end of said clamper, said movable unit having a third mortise;
- a first dual-convex tenon with a first convexity and a second convexity opposite said first convexity, wherein said first convexity and said second convexity are coupled to said third mortise and said first mortise, respectively;
- a second dual-convex tenon with a third convexity and a fourth convexity opposite said third convexity, wherein said third convexity is coupled to said second mortise; and
- a fourth mortise at a second end of said clamper, opposite said first end, wherein said fourth mortise is coupled to said fourth convexity.

2. The thermal connector apparatus of claim 1, wherein said clamper comprises a screw hole to accommodate a screw rod therein, said movable unit further having a through hole to accommodate a fixer therein.

3. The thermal connector apparatus of claim 2, said screw rod having a rotatable stick for installing and de-installing.

4. The thermal connector apparatus of claim 1, wherein said first wedge unit comprises a first recess;

said second wedge unit comprises a second recess;

said clamper comprises at least two third recesses, which correspond to said first and second recesses respectively; and wherein a magnetically permeable plate is embedded into said first and second recesses, a magnetic plate being embedded into said at least two third recesses.

5. The thermal connector apparatus of claim 1, wherein said first and second dual-convex tenons and said first, second, third and fourth mortises are shaped as a dovetail.

6. The thermal connector apparatus of claim 1, said retainer further comprising:
a third wedge unit having a fourth recess to receive a magnetically permeable plate, and said clamper having a fifth recess to receive a magnetic plate for matching with said third wedge unit.

7. The thermal connector apparatus of claim 1, wherein said clamper comprises a handle for moving said movable unit.

8. The thermal connector apparatus of claim 1, wherein said first wedge unit has a first recess, said second wedge unit has a second recess, and wherein a magnetically permeable plate is embedded into said first and second recesses.

9. The thermal connector apparatus of claim 1, wherein said clamper comprises a screw hole to accommodate a screw rod, said clamper further having a handle; and said movable unit further having a through hole to accommodate a fixer therein.

* * * * *